(12) United States Patent
Dorlin et al.

(10) Patent No.: US 12,111,358 B2
(45) Date of Patent: Oct. 8, 2024

(54) AUXILIARY MODULE FOR AN ELECTRICAL SWITCHING DEVICE, AND ASSOCIATED SWITCHING DEVICE AND MONITORING SYSTEM

(71) Applicant: Schneider Electric Industries SAS, Rueil Malmaison (FR)

(72) Inventors: Flavien Dorlin, Grenoble (FR); Laurent Burdy, Theys (FR); Joseph Pellicano, St Alban Leysse (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 149 days.

(21) Appl. No.: 17/855,897

(22) Filed: Jul. 1, 2022

(65) Prior Publication Data

US 2023/0014111 A1    Jan. 19, 2023

(30) Foreign Application Priority Data

Jul. 9, 2021 (FR) ..................... 2107462

(51) Int. Cl.
   *G01R 31/327* (2006.01)
   *H05K 1/11* (2006.01)
   *H05K 1/14* (2006.01)

(52) U.S. Cl.
   CPC ......... *G01R 31/327* (2013.01); *H05K 1/112* (2013.01); *H05K 1/14* (2013.01)

(58) Field of Classification Search
   CPC ........ G01R 31/327; H05K 1/112; H05K 1/14; H05K 1/111; H05K 1/115; H05K 1/141;
   (Continued)

(56) References Cited

U.S. PATENT DOCUMENTS

| | | | | |
|---|---|---|---|---|
| 4,500,934 A | * | 2/1985 | Kinsinger | H01H 9/542 361/13 |
| 2009/0213018 A1 | * | 8/2009 | Yang | H01Q 1/243 343/702 |

(Continued)

FOREIGN PATENT DOCUMENTS

DE    102018221033 A1    6/2020

OTHER PUBLICATIONS

French Search Report and Written Opinion dated Mar. 7, 2022 for corresponding French Patent Application No. FR2107462, 7 pages.

*Primary Examiner* — Jermele M Hollington
*Assistant Examiner* — Zannatul Ferdous
(74) *Attorney, Agent, or Firm* — Locke Lord LLP

(57) ABSTRACT

The disclosure relates to an auxiliary module for an electrical switching device including an input, an output, a first housing and a switching module which is configured to switch between a first configuration in which the switching module allows a current to flow between the input and the output and a second configuration in which the switching module blocks the current, the first housing defining a chamber which accommodates the switching module and defining a space for receiving the auxiliary module, the space containing a signalling member configured to transmit information relating to a state of the electrical switching device to the auxiliary module when the auxiliary module is in the space. This auxiliary module comprises a controller configured to generate a message and a radiofrequency communication module configured to transmit the message, via a radiofrequency data link, to a remote device.

14 Claims, 7 Drawing Sheets

(58) Field of Classification Search
CPC ........ H01H 9/167; H01H 71/46; H01H 73/12; H01H 71/04; H01H 9/168; H01H 9/16; H01H 71/0207; G08C 17/02
See application file for complete search history.

(56) References Cited

U.S. PATENT DOCUMENTS

| | | | |
|---|---|---|---|
| 2013/0329331 A1* | 12/2013 | Erger | H01H 9/168 361/102 |
| 2016/0033553 A1* | 2/2016 | Varone | H01H 71/04 702/67 |
| 2019/0140429 A1 | 5/2019 | Mascarenhas et al. | |
| 2019/0140439 A1 | 5/2019 | Mascarenhas et al. | |
| 2020/0144000 A1* | 5/2020 | Gassmann | H01C 10/50 |

* cited by examiner

AUXILIARY MODULE FOR AN ELECTRICAL SWITCHING DEVICE, AND ASSOCIATED SWITCHING DEVICE AND MONITORING SYSTEM

TECHNICAL FIELD

The present invention relates to an auxiliary module for an electrical switching device. The present invention also relates to an electrical switching device comprising such an auxiliary module.

BACKGROUND

Electrical switching devices are used in a very large number of installations to control electric currents, in particular to interrupt electric currents either upon command from an operator or automatically in the event of detecting an electrical fault, for example an overvoltage, an overcurrent, an electric arc or even a short circuit or the like.

These devices therefore play an important role in the safety of electrical installations containing them, and it is important to be able to ascertain the state of each of these switching devices in order to ensure the correct operation of these installations. For example, ascertaining that a switching device has disconnected the current following the detection of a fault often involves correcting this fault before putting the installation back into operation, while if this switching device is in its closed state, in which it allows current to flow, there is no need to intervene.

To this end, it is known to use auxiliary modules, which may be added to some electrical switching devices in order to detect the state of the switching device and to transmit this information to a device for monitoring the installation. For this purpose, the auxiliary modules comprise a mechanical element actuated by a corresponding member of the switching device depending on the state of the latter, the position of this mechanical element modifying a property of an electrical circuit of the auxiliary module, the circuit being connected to the monitoring device by one or more conductors. Modifying the properties of an electric current or of a voltage of the one or more conductors thus informs the monitoring device about the state of the switching device.

However, the presence of the electrical conductors connecting the auxiliary module to the monitoring device makes it difficult to integrate the auxiliary modules, since the installation into which they are integrated has to allow for the passage of these conductors. Furthermore, if some conductors are damaged, the auxiliary module is rendered inoperative, since the signal that it generates cannot be transmitted to the monitoring device.

SUMMARY

There is therefore a need for an auxiliary module for an electrical switching device that is able to indicate a state of the switching device to a device remote therefrom, and that is simpler to integrate and safer than auxiliary modules from the prior art.

To this end, what is proposed is an auxiliary module for an electrical switching device, the electrical switching device comprising at least an input, an output, a first housing and a switching module configured to switch between a first configuration in which the switching module allows an electric current to flow between the input and the output and a second configuration in which the switching module blocks the flow of the current between the input and the output, the first housing defining a chamber that accommodates the switching module, the first housing furthermore defining a space for receiving the auxiliary module, the space containing at least one signalling member configured to transmit first information relating to a state of the electrical switching device to the auxiliary module when the auxiliary module is accommodated in the space, the auxiliary module comprising a controller configured to generate a message containing second information representative of the transmitted first information and a radiofrequency communication module configured to transmit the message, via a radiofrequency data link, to a device remote from the electrical switching device.

By virtue of using a radiofrequency data link, it is no longer necessary to provide dedicated passages for the electrical conductors connecting the auxiliary module to the monitoring device, and the risk of loss of communication between the auxiliary module and the monitoring device is reduced since it is then no longer sensitive to damage to an electrical conductor. The auxiliary module is therefore both easier to integrate and safer.

According to some advantageous but non-obligatory embodiments, the auxiliary module has one or more of the following features, taken on their own or in any technically possible combination:

the auxiliary module comprises a second housing, a first printed circuit board, a second printed circuit board and a mobile element, the second housing defining a chamber that accommodates the first board and the second board, the first printed circuit board carrying the controller and extending in a first plane, the second printed circuit board being connected to the first printed circuit board and extending from the first printed circuit board in a direction perpendicular to the first plane, the second printed circuit board carrying an electrical circuit connected to the controller, the mobile element being configured to be moved in translation by the signalling member in a direction of translation between a first position in which the electrical circuit is open and a second position in which the mobile element closes the electrical circuit, the state of the switching device being indicated by the open or closed state of said electrical circuit.

the direction of translation is perpendicular to a second plane of extension of the second printed circuit board, the direction of translation being in particular a direction in which the auxiliary module is able to be inserted into the space or extracted from the space.

the second printed circuit board comprises at least one projection inserted into a hole passing through the first printed circuit board so as to prevent a relative translational movement of the two printed circuit boards with respect to one another in the first plane.

the first printed circuit board carries at least two first connection pads and the second printed circuit board carries at least two second connection pads, each first or second pad being carried by a face of the corresponding board, each second pad being connected to one of the first connection pads so as to allow an electric current to flow between the first connection pad and the second connection pad, the two second pads or two of the second pads being connected to said electrical circuit, each first pad being soldered to the corresponding second pad by an electrically conductive metal mass.

the second printed circuit board has two faces defining the second board in a direction perpendicular to the second plane, each of the two faces of the second board carrying at least one of the second connection pads.

each printed circuit board comprises, for at least one of the first or second pads of the board under consideration, a set of vias passing through the board in a direction perpendicular to the first or second plane of extension of the board under consideration, each via opening out through the first or second pad and containing a metal element passing through the printed circuit board under consideration.

the auxiliary module comprises an electrical energy storage member intended to supply electric power to the controller and the communication module, the storage member extending in a third plane parallel to the first plane and having at least one lateral face defining the storage member in the third plane, the storage member comprising a first electrical contact and a second electrical contact and being configured to impose a voltage between the first contact and the second contact, the lateral face carrying the first electrical contact, the first electrical contact being connected to a third electrical contact carried by the second printed circuit board, the third electrical contact being connected to the controller and to the communication module via one of the second connection pads, there being three or more second connection pads.

the first printed circuit board comprises a fourth electrical contact connected to the controller and to the communication module, the second electrical contact bearing against the fourth electrical contact.

the communication module comprises an antenna, the antenna comprising a region free of any metal coating of the first printed circuit board and an exciter configured to generate at least one electromagnetic wave in said region.

the auxiliary module is intended for a switching device whose first housing has a front face intended to be accessible to an operator when the switching device is operational, wherein, when the auxiliary module is accommodated in said space, the exciter is interposed between said region and the front face.

the auxiliary module is intended for a switching device whose first housing has a front face intended to be accessible to an operator when the switching device is operational, wherein the first printed circuit board has a first end and a second end, the first end and the second end together defining the first board in a first direction perpendicular to the front face, the first end being, out of the first end and the second end, the end closer to the front face, wherein the antenna is carried by the first end.

What is also proposed is an electrical switching device comprising at least an input, an output, a first housing, an auxiliary module as described above and a switching module configured to switch between a first configuration in which the switching module allows an electric current to flow between the input and the output and a second configuration in which the switching module blocks the flow of the current between the input and the output, the first housing defining a chamber that accommodates the switching module, the first housing furthermore defining a space for receiving the auxiliary module, the space containing at least one signalling member configured to transmit first information relating to a state of the electrical switching device to the auxiliary module when the auxiliary module is accommodated in the space.

According to one embodiment, the first housing defines a plurality of reception spaces each configured to accommodate an auxiliary module as described above, each reception space being associated with a respective state of the electrical switching device, different from the state associated with each other reception space, each reception space containing a respective signalling member configured to transmit first information relating to the associated state to an auxiliary module when the auxiliary module is accommodated in the reception space.

What is also proposed is a system for monitoring an electrical installation, comprising at least a switching device as described above and a monitoring device configured to receive each message transmitted by the one or more auxiliary modules.

BRIEF DESCRIPTION OF THE DRAWINGS

Features and advantages of the invention will become apparent upon reading the following description, given solely by way of non-limiting example and with reference to the appended drawings, in which.

DETAILED DESCRIPTION

Figure 1:
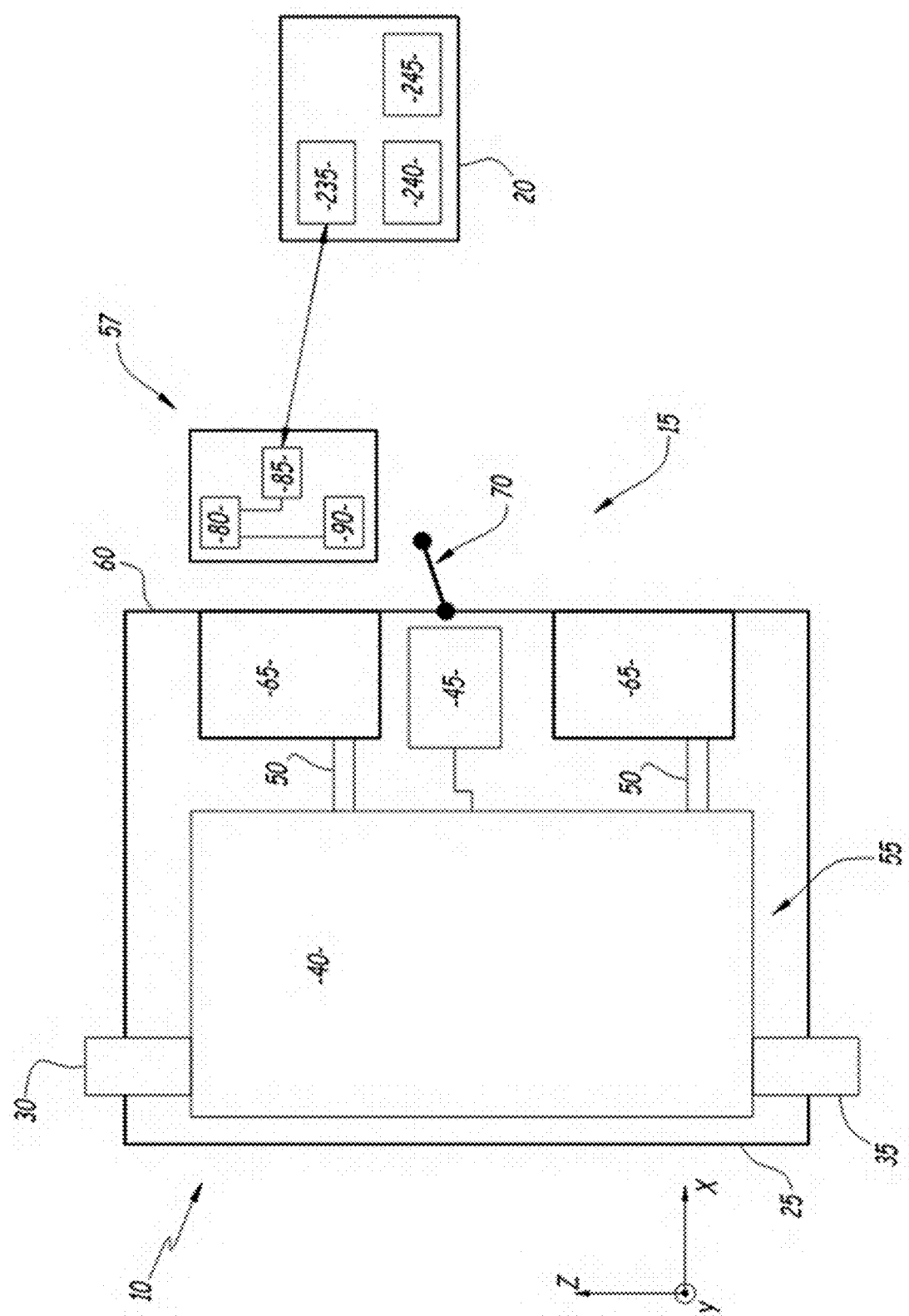
FIG. 1 is a schematic depiction of one example of a monitoring system comprising an auxiliary module according to the invention.

One example of a system 10 for monitoring an electrical installation is shown in FIG. 1.

The system 10 comprises an electrical switching device 15 and a monitoring device 20.

The switching device 15 comprises a first housing 25, an input 30, an output 35, a switching mechanism 40, a control module 45, at least one signalling member 50 and at least one auxiliary module 57.

It should be noted that the number of inputs 30, outputs 35, switching mechanisms 40, control modules 45 and signalling members 50 is liable to vary.

For example, some embodiments of the switching device 15 are liable to comprise n inputs 30, n outputs 35, n switching mechanisms 40, n control modules 45, n being an integer strictly greater than 1, for example between 2 and 4. As a variant, a single control module 45 is liable to be present and to interact with n switching mechanisms 40 associated with n inputs 30 and n outputs 35.

The first housing 25 defines a first chamber 55 that accommodates at least the switching mechanism 40 and the control module 45. The first housing 25 is in particular configured to electrically insulate the switching mechanism 40 and the control module 45 from the outside of the first housing 25.

For example, the first housing 25 is made of an electrically insulating material such as polycarbonate.

The first housing 25 is for example substantially parallelepipedal. However, other first housing 25 shapes are also conceivable.

The first housing 25 is for example intended to be fastened in a space in an electrical installation, for example to be fastened to a wall or a panel of an electrical enclosure.

The first housing 25 has a front face 60.

Furthermore, the first housing 25 defines at least once space 65 for receiving an auxiliary module 57.

The front face 60 is intended to be accessible to an operator when the switching device 15 is operational, in particular when the switching device 15 is integrated into an electrical installation. The front face 60 comprises for example one or more members 70 accessible to an operator in order to interact with the switching device 15.

Three directions X, Y and Z are defined in FIG. 1. These three directions X, Y, Z are perpendicular to one another. The direction Z is for example a vertical direction when the switching device 15 is installed in an installation. The front face 60 is perpendicular to the direction X in FIG. 1.

Each space 65 is for example formed on the front face 60.

Each space 65 is for example formed by a recess formed in a face, in particular in the front face 60, of the first housing 25.

For example, each space 65 is defined by corresponding walls of the first housing 25, and extends in the direction X towards the inside of the first housing 25 from the front face 60.

It will be clearly obvious to a person skilled in the art that directions other than the direction X may be conceivable, and that each space 65 is liable to open out on any face of the first housing 25.

Each space 65 contains in particular a corresponding signalling member 50.

Each space 65 is for example complementary to the corresponding auxiliary module 57, so as to prevent any relative movement between the first housing 25 and the auxiliary module 57, when the auxiliary module is accommodated in the space 65, except for a movement of extracting the auxiliary module 57 from the space 65.

Each space 65 is in particular intended to allow the auxiliary module 57 to be inserted or extracted through a translational movement of the auxiliary module 57 with respect to the first housing 25, in the direction of extension of the space 65, which is the direction X in the example shown.

The one or more members 70 include for example a member able to be actuated by an operator in order to control the switching mechanism 40 and/or the control module 45, in particular a rotary lever, or else a set of elements able to indicate a state of the switching device 15 to an operator, for example one or more indicator lights.

Each input 30 is configured to be connected to an electrical conductor, in particular to an electrical conductor of the installation containing the switching device 15, in a manner known per se. The input 30 is for example formed by a connection terminal for fastening the electrical conductor in such a way as to enable the electrical connection between a conductive part of the input 30 and the conductor.

Each input 30 is in particular configured to receive an electric current from the corresponding conductor and to transmit the received electric current to the switching mechanism 40.

Each output 35 is configured to be connected to an electrical conductor, in particular to an electrical conductor of the installation containing the switching device 15, in a manner known per se. The output 35 is for example formed by a connection terminal for fastening the electrical conductor in such a way as to enable the electrical connection between a conductive part of the output 35 and the conductor.

Each output 35 is in particular configured to receive an electric current from the switching mechanism 40 and to transmit the received electric current to the corresponding conductor.

Each switching mechanism 40 is connected to an input 30 and to a corresponding output 35.

In particular, each switching mechanism 40 is connected to an input 30 and to an output 35 that are arranged on opposing faces of the first housing 25 that define this housing 25 in the direction Z. In this case, each mechanism 40 extends substantially in the direction Z.

Each switching mechanism 40 is configured, in a manner known per se, to switch between a first configuration and a second configuration.

In the first configuration, the switching mechanism 40 allows an electric current to flow between the corresponding input 30 and the corresponding output 35.

In the second configuration, the switching mechanism 40 electrically isolates the input 30 from the output 35.

The control module 45 is configured to control the switching of at least one switching mechanism 40 between the first configuration and the second configuration.

For example, the control module 45 is configured, in a manner known per se, to detect an electrical fault in the current flowing between an input 30 and the corresponding output 35, and to control the switching of the switching mechanism 40 connecting the input 30 and the output 35 from its first configuration to its second configuration. The fault is for example an electric arc, an overvoltage, an undervoltage, an overcurrent, or even a short circuit.

In such a case, the switching device 15 is for example a circuit breaker.

As a variant or in addition, the control module 45 is configured to switch the switching mechanism 40 from its first configuration to its second configuration, or vice versa, following the receipt of a command transmitted by a device remote from the switching device 15, for example by the monitoring device 20. The command is for example an electrical signal transmitted by a conductor connecting the switching mechanism 40 to the remote device.

Switching devices 15 in which the control module 45 is controlled by a remote device and is not configured to detect a fault are sometimes called "relays" or "switches". However, circuit breakers able to be controlled remotely by another device are also conceivable.

As a variant or in addition, the control module 45 is configured to switch the switching mechanism 40 from its first configuration to its second configuration, or vice versa, following actuation of a dedicated member 70 (in particular a lever) by an operator.

It should be noted that, according to another variant, the switching mechanism 40 is directly toggled from the first to the second configuration, or vice versa, by a member 70 without the involvement of the control module 45.

Each signalling member 50 is associated with a space 65. For example, the signalling member 50 is at least partially contained within the space 65.

Each signalling member 50 is configured to transmit, to an auxiliary module 57 accommodated in the associated space 65, first information relating to a state of the switching device 15.

Each signalling member 50 is for example configured to move at least part of the signalling member 50 between two positions depending on the state of the switching device 15. The position of said part thus indicates the state of the switching device 15.

The two positions differ in particular in that at least part of the signalling member 50 is moved, between its two positions, in the direction of insertion X of the auxiliary module 57 into the space 65.

In particular, in one of the two positions, at least part of the signalling member 50 is accommodated in the space 65.

As a variant, the signalling member 50 comprises an opening formed in one of the walls that define the space 65, and the mobile part of the signalling member 50 is arranged in the chamber 55 facing the corresponding opening.

Each signalling member 50 is in particular configured to indicate a state or different states of each other signalling member 50, that is to say signalling members 50 associated with any other spaces 65.

For example, a signalling member 50 is configured to indicate whether the switching mechanism 40 is in its first configuration or in its second configuration.

One signalling member 50 is for example configured to indicate whether the switching mechanism 40 has been switched to its second configuration upon command from the control module 45 following detection of a fault.

Another signalling member 50 is configured to indicate whether the switching mechanism 40 has been switched to its second configuration upon command from the control module 45 following receipt of a switching command issued by a remote device.

Another signalling member 50 is in particular configured to indicate whether the switching mechanism 40 has been switched to its second configuration following actuation of a member 70 by an operator.

Each auxiliary module 57 is configured to be accommodated in a corresponding space 65. For example, each auxiliary module 57 is able to be accommodated indiscriminately in any of the spaces 65 when multiple spaces 65 are present.

An "auxiliary module" is in particular understood to mean that the auxiliary module 57 is removable from the switching device 15, and in particular that the auxiliary module 57 is able to be extracted from the space 65 in which it is accommodated.

Furthermore, the switching device 15 is able to operate in the absence of any auxiliary module 57, in which case the switching of the switching member 40 still takes place, but no information about the state of the switching device 15 is sent to the monitoring device 20.

Figure 2:
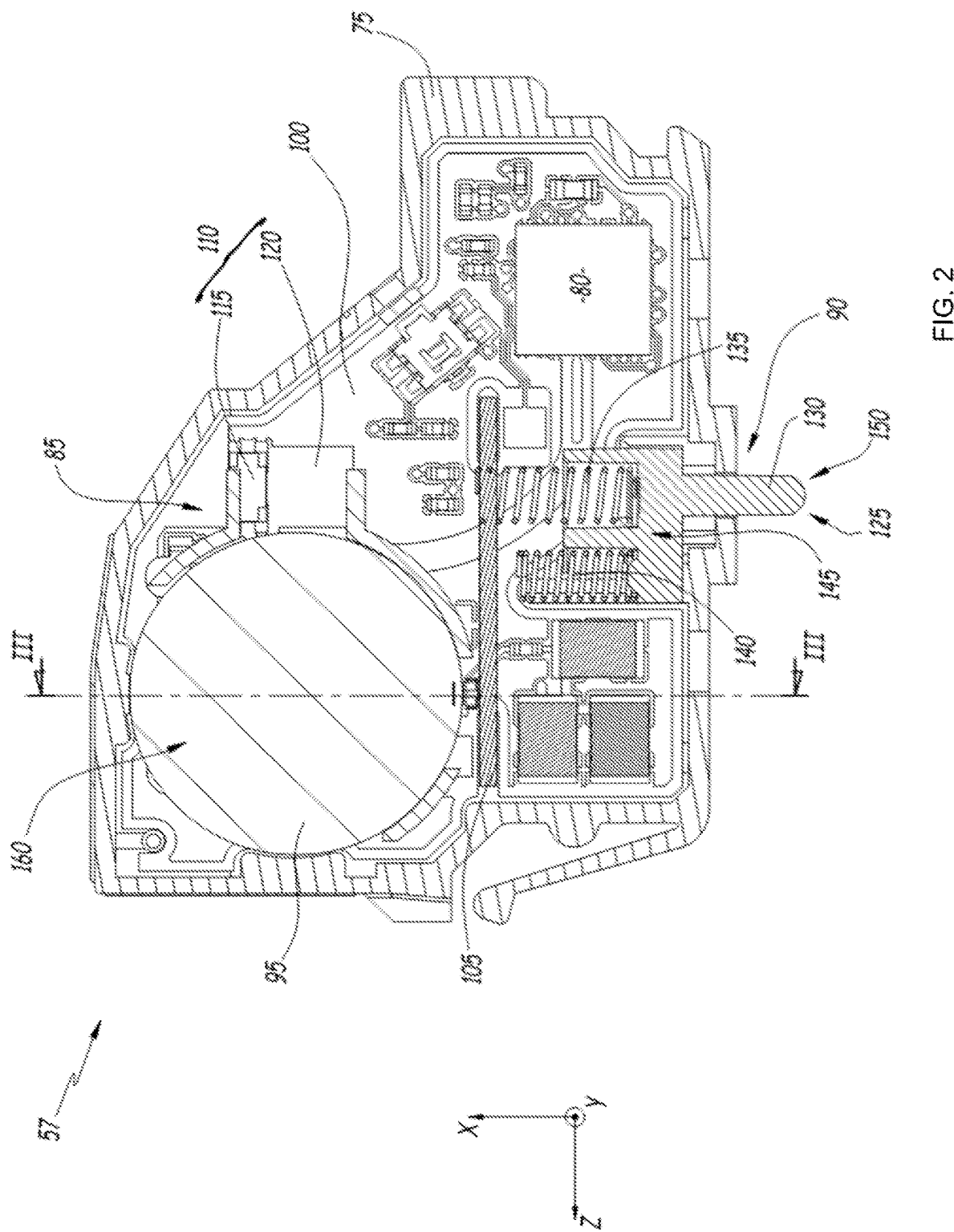
FIG. 2 is a cross-sectional view of a first example of an auxiliary module according to the invention, comprising, inter alia, two printed circuit boards.
Figure 3:
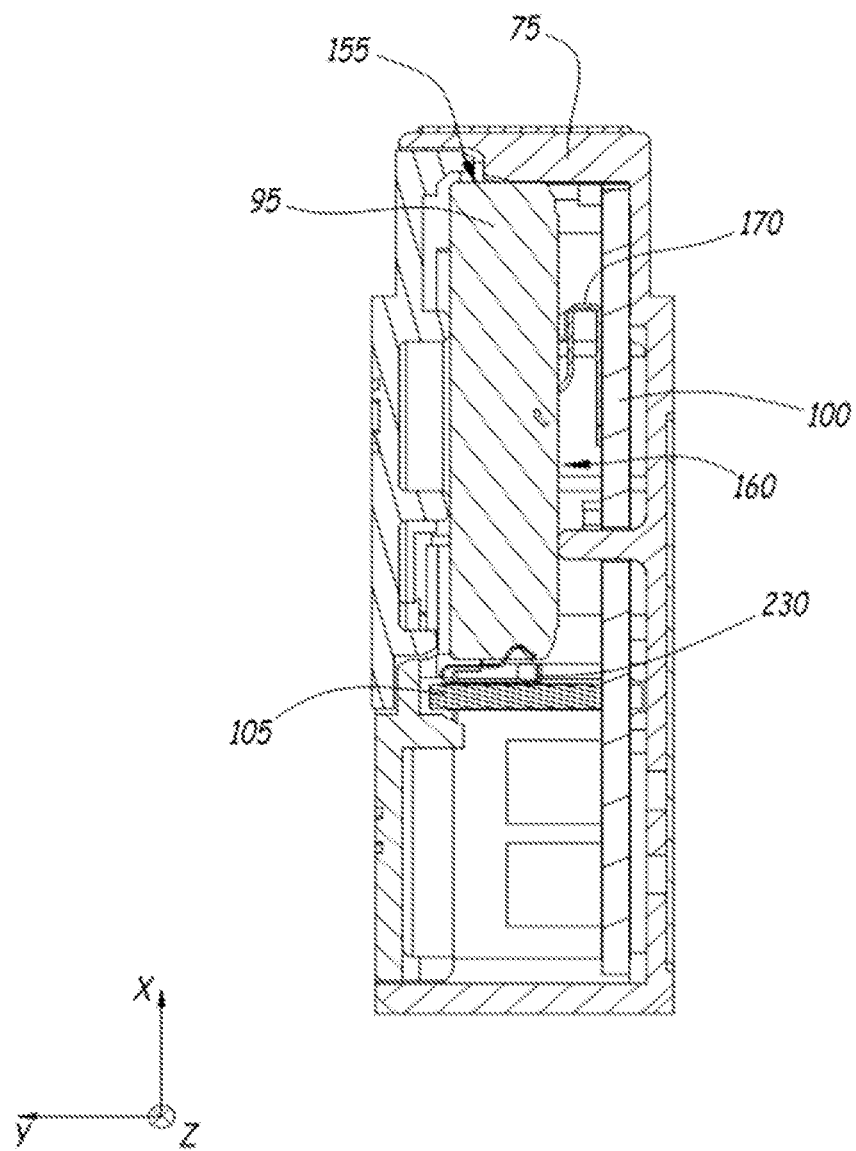
FIG. 3 is another cross-sectional view of the first example of an auxiliary module from FIG. 2.

A first example of an auxiliary module 57 is shown in cross section in FIG. 2. The cross section of FIG. 2 is a cross section in a plane formed by the directions X and Z when the auxiliary module 57 is accommodated in the corresponding space 65. A cross section in the plane B-B, parallel to the plane formed by the directions X and Y, is shown in FIG. 3.

Each auxiliary module 57 is configured to receive first information relating to a state of the switching device 15 from the signalling member 50 in a space in which the auxiliary module 57 is inserted.

Each auxiliary module 57 comprises a second housing 75, a controller 80, a communication module 85, means 90 for receiving the first information and an electrical energy storage member 95.

In the embodiments shown in the figures, the auxiliary module 57 furthermore comprises a first printed circuit board 100 and a second printed circuit board 105.

The second housing 75 defines a second chamber that accommodates the controller 80, the communication module 85, at least part of the means 90 for receiving the first information, the electrical energy storage member 95, the first printed circuit board 100 and the second printed circuit board 105.

The second housing 75 is made of an electrically insulating material, so as to electrically insulate the controller 80, the communication module 85, at least part of the means 90 for receiving the first information, the electrical energy storage member 95, the first printed circuit board 100 and the second printed circuit board 105 from the outside of the second housing 75.

The second housing 75 is for example made of polycarbonate.

The controller 80 is configured to receive, from the reception means 90, the first information transmitted by the signalling member 50. The controller 80 is furthermore configured to generate a message to the monitoring device 20 containing second information.

The second information is information representative of the received first information.

For example, the controller 80 receives, on one of its ports, the first information in the form of a two-level electrical signal, in particular an electrical signal having a voltage or current other than zero when the switching device 15 is in a first state and equal to zero when the switching device 15 is in a second state.

The second information comprises for example a first numerical value (for example "0" or "1") or text value (for example "on" or "off") dependent on the received first information, and optionally an identifier of the auxiliary module 57, for example a serial number.

The controller 80 is for example configured to generate the message when a change of state of the switching device 15 is signalled by the signalling member 50, in particular when the controller 80 detects a change in the value of a parameter (in particular the voltage) of the received electrical signal.

As a variant, the controller 80 is configured to generate the message periodically, the message then containing second information representative of the state of the switching device 15 at a time of generation of the message.

The controller 80 is furthermore configured to transmit the message to the communication module 85, for example in the form of an electrical signal, and to command the transmission, by the communication module 85, of the message to the monitoring device 20.

The controller 80 is for example formed by a processor and a memory containing software instructions that lead to the message being generated and the transmission thereof being commanded when the software instructions are executed by the processor.

As a variant, the controller 80 is formed by a set of dedicated electronic components (for example in the form of an application-specific integrated circuit or ASIC), or else by a set of programmable logic components.

The communication module 85 is configured to transmit the message to the monitoring device 20 via a radiofrequency data link.

This means that the communication module 85 is configured to convert the message generated by the controller 80 into a set of radiofrequency electromagnetic waves, and to transmit these electromagnetic waves to the monitoring device 20.

Radiofrequency waves are electromagnetic waves having a frequency of between 3 kilohertz (kHz) and 6 gigahertz (GHz).

In particular, the communication module 85 is configured to convert the message into a set of radiofrequency electromagnetic waves having a frequency of between 2.4 GHz and 2.4835 GHz.

According to one embodiment, the communication module 85 is configured to use a ZigBee communication protocol. The ZigBee protocol is defined by the "Zigbee Alliance", and is based on the IEEE 802.15.4 protocol defined by the Institute of Electrical and Electronics Engineers or IEEE.

The communication module 85 comprises an antenna 110.

The antenna 110 comprises an exciter 115 and a region 120 of the first printed circuit board 100.

The exciter 115 is configured to generate, in the region 120, a set of electromagnetic waves intended to transmit the message.

The exciter 115 is in particular interposed in the direction X of insertion of the auxiliary module 57 into the space 65 between the region 120 and the front face 60 when the auxiliary module 57 is accommodated in the space 65.

The reception means 90 are configured to receive the first information from the signalling member 50 in the space 65 in which the auxiliary module 57 is accommodated and to transmit said first information to the controller 80.

The reception means 90 comprise for example an electrical circuit and a mobile element 125.

The electrical circuit is carried by one of the two printed circuit boards 100, 105, in particular by the second printed circuit board 105.

The electrical circuit is electrically connected to the controller 80.

The electrical circuit is for example configured to be closed by the mobile element 125. In particular, the electrical circuit comprises two portions, each connected to the controller 80, the mobile element 125 being intended to come into contact with the two portions of the circuit in order to close the circuit.

The electrical circuit is for example connected, at its two ends, to two ports of the controller 80, the controller 80 being configured to impose a potential difference between the two ports and to detect the closure or the opening of the circuit based for example on variations in the potential difference or based on the presence or absence of an electric current flowing between the two ports.

The mobile element 125 extends in one direction, for example the direction of insertion X of the auxiliary module 57.

The mobile element 125 is able to move in translation in its direction of extension, here the direction X.

The mobile element 125 is in particular configured to be moved by the signalling member 50 between a first position, in which at least part of the mobile element 125 is remote from the electrical circuit, and a second position, in which the mobile element 125 is in contact with said circuit and closes the circuit.

The mobile element 125 is shown in FIG. 2 in its first position.

The mobile element 125 comprises in particular a mobile finger 130, a first spring 135 and a second spring 140.

The mobile finger 130 extends for example in the direction of extension of the mobile element 125, that is to say here the direction X.

The mobile finger 130 is in particular intended to pass through a face defining the second housing 75 in the direction X, and in particular a face facing the bottom of the space 65, i.e. that face of the second housing 75 that is furthest from the front face 60.

The mobile finger 130 is made for example of an electrically insulating material.

The mobile finger 130 has a first end 145 and a second end 150.

The first end 145 is accommodated inside the second housing 75.

The first end 145 is fastened to the first spring 135 and to the second spring 140.

The first end 145 comprises at least one electrically conductive element electrically connecting the first spring 135 to the second spring 140. This conductive element is for example formed by a finger connecting the springs 135, 140 to one another. The finger is in particular integral with one of these two springs 135, 140, for example.

In a manner known per se, the first end 145 optionally comprises one or more elements that contribute to keeping the first spring 135 and the second spring 140 in position with respect to the first end 145.

The second end 150 is situated inside the second housing 75.

The second end 150 is configured to bear against the signalling member 50 such that the movement of the signalling member 50 in the direction X applies, to the second end 150, a force that tends to move the mobile element 125 from the first position to the second position.

The first spring 135 bears against the first end 145 and against the second printed circuit board 105. In particular, the first spring 135 is in contact with a portion of the electrical circuit carried by the second printed circuit board 105.

The first spring 135 exerts, on the first end 145, a force that tends to move the first end 145 away from the second printed circuit board 105.

The first spring 135 extends in the direction in which the mobile element 125 is intended to move, here the direction X.

One end of the second spring 140 is fastened to the first end 145.

The second spring 140 extends in the direction in which the mobile element 125 is intended to move, here the direction X.

The second spring 140 is configured such that, when the mobile element 125 is in the first position, that end of the second spring 140 that is not fastened to the first end 145 is not in contact with the second printed circuit board 105, and in particular not in electrical contact with the electrical circuit carried by this board 105. Thus, when the mobile element 125 is in the first position, the electrical circuit is open and no electric current flows between the two corresponding ports of the controller 80.

When the mobile element 125 is in the second position, that end of the second spring 140 that is not fastened to the first end 145 is in contact with the second printed circuit board 105, and in particular in electrical contact with the carried electrical circuit so as to close the circuit.

Thus, when the mobile element 125 is in the second position, an electric current is able to flow between the two corresponding terminals of the controller, by flowing successively through a portion of the circuit, the first spring 135, the conductive element carried by the first end 145, the second spring 140 and the other portion of the electrical circuit.

The storage member 95 is configured to store electrical energy, and to supply electric power to the controller 80 and the communication module 85 with an electric supply current generated from the stored electrical energy.

The storage member 95 extends in a plane of extension, this plane in particular being parallel to the plane formed by the directions X and Z. In particular, a thickness of the storage member 95 in the direction Y is for example at least two times lower than a maximum extension of the storage member in a direction of its plane of extension.

The storage member 95 has a lateral face 155 and two end faces 160.

The lateral face 155 defines the storage member 95 in its plane of extension. The lateral face 155 is for example cylindrical and has a central axis perpendicular to the plane of extension, therefore here parallel to the direction Y.

The end faces 160 each extend parallel to the plane of extension of the storage member 95 and, together, define the storage member 95 in the direction Y.

The storage member 95 comprises a first electrical contact and a second electrical contact, and is configured to impose a voltage between the first contact and the second contact so as to generate the electric supply current.

The first contact is carried by the lateral face 155. For example, the first contact is formed by a portion or by all of the lateral face 155, in which case the lateral face 155 is made of an electrically conductive material.

The second contact is carried by one of the end faces 160, for example formed by one of the end faces 160, in this case made of an electrically conductive material.

Figure 4:
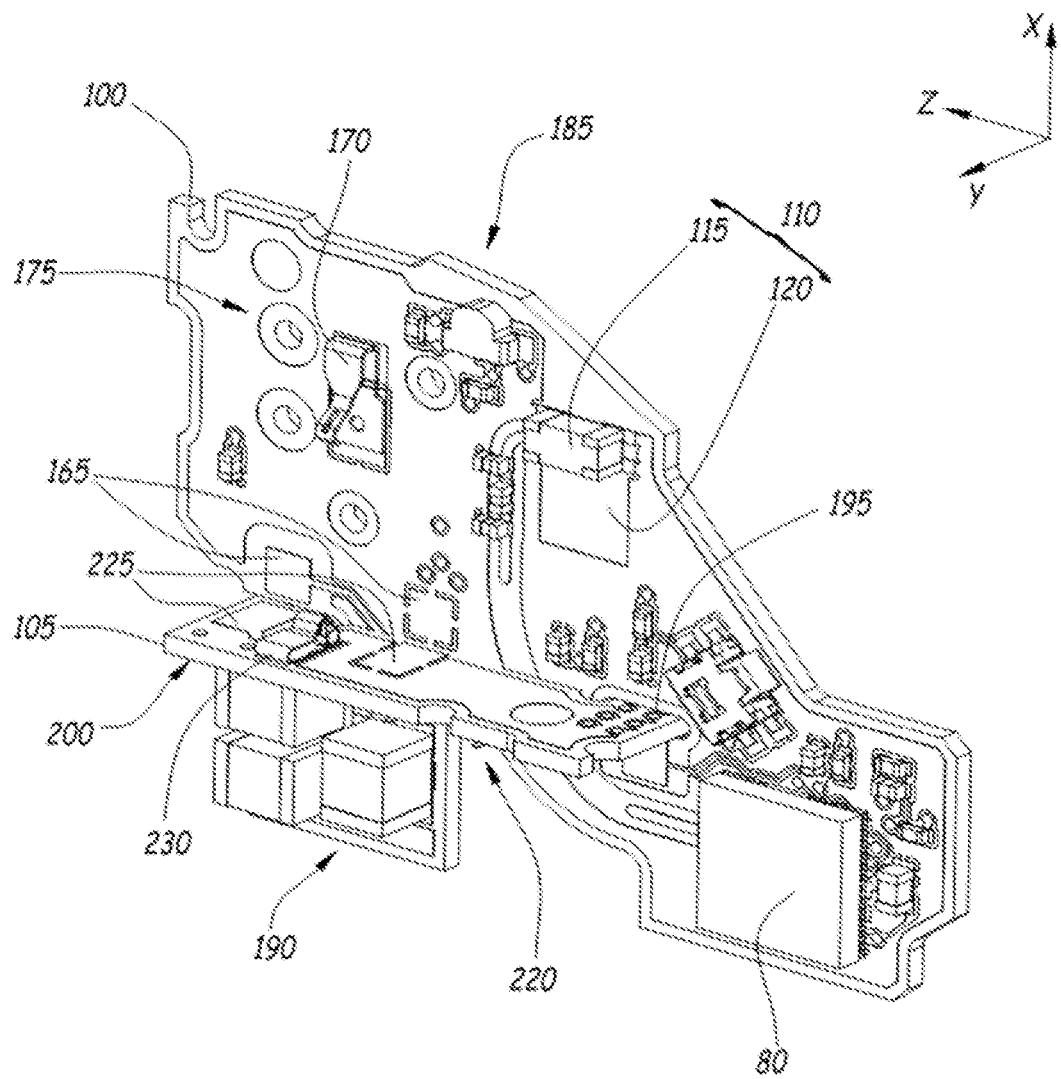
FIG. 4 is a perspective view of the two boards of the first example of an auxiliary module.
Figure 5:
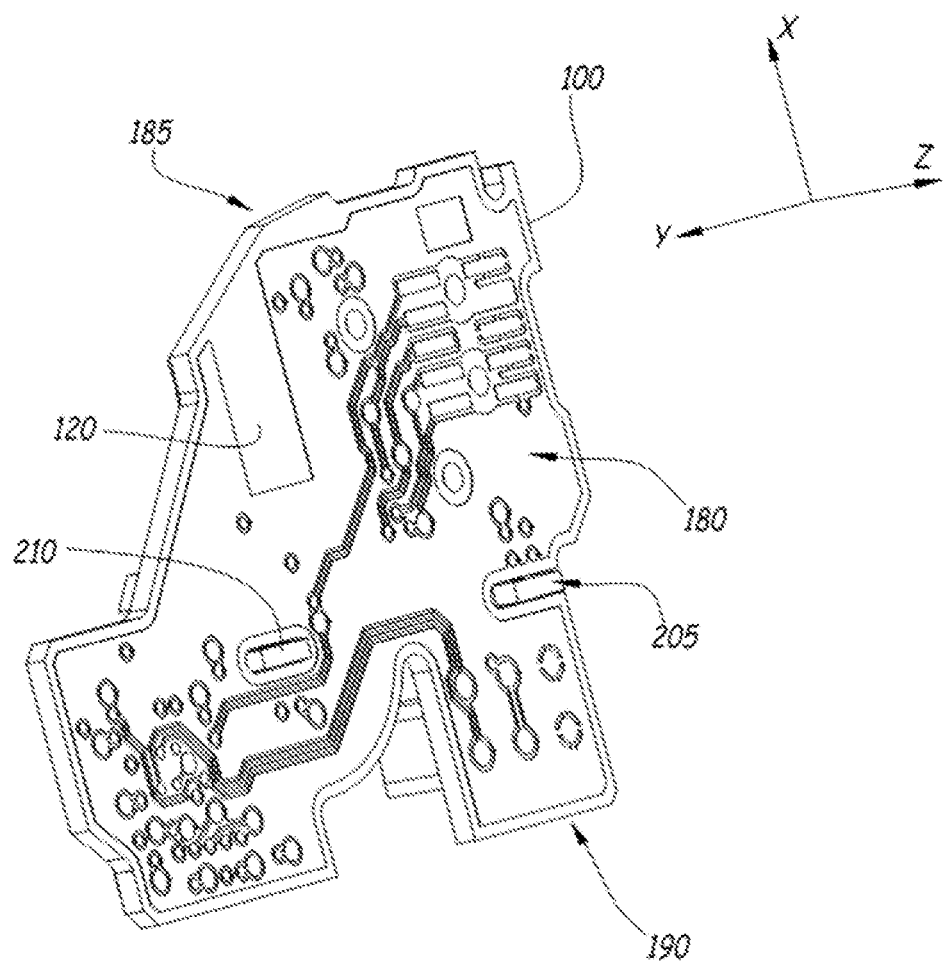
FIG. 5 is another perspective view of the two boards of the first example of an auxiliary module.

The first and the second printed circuit board 100, 105 of the first example of an auxiliary module 57 are shown in perspective, while the elements carried by these two boards 100, 105 are shown in two different viewpoints in FIGS. 4 and 5.

A "printed circuit board" 100, 105 is in particular understood to mean a substantially flat board comprising at least one plate of electrically insulating material carrying at least one layer of an electrically conductive material, each layer partially covering a face of the plate so as to electrically connect a set of elements, in particular electronic components and electrical contacts.

Each plate is for example made of a composite material, in particular comprising a set of glass fibres held in an epoxy resin matrix or plastic matrix, or else a composite material such as FR4 or a polyimide.

Each printed circuit board 100, 105 comprises in particular a set of plates stacked in a direction perpendicular to the plane in which the board 100, 105 extends, a conductive layer being interposed between each of the plates and the contiguous plates, each face defining the board 100, 105 in the abovementioned direction also comprising a corresponding layer, the various layers being connected to one another by vias each passing through one or more plates.

Each printed circuit board 100, 105 has for example a thickness (measured in a direction perpendicular to the plane of extension of the board 100, 105 under consideration) of between 0.5 millimetres (mm) and 5 mm, in particular equal to 0.8 mm.

Each conductive layer has a thickness for example of between 10 micrometres (μm) and 50 μm, in particular equal to 35 μm.

The first printed circuit board 100 extends in a plane parallel to the direction in which the auxiliary module 57 is configured to be inserted into or extracted from the space 65, in particular in a plane parallel to the directions X and Z.

In particular, the plane of extension of the first printed circuit board 100 is parallel to the plane of extension of the storage member 95.

The first printed circuit board 100 carries the controller 80 and the communication module 85, in particular the exciter 115 of the antenna 110.

The first printed circuit board 100 furthermore carries at least two first connection pads 165, for example three first connection pads 165, and a third electrical contact 170, and also a set of electrical or electronic components, the latter not being described as they are liable to vary from one embodiment to another.

The first printed circuit board 100 has a first face 175 (visible in FIG. 4) and a second face 180 (visible in FIG. 5), and also a third end 185 and a fourth end 190.

The faces 175 and 180 define the first printed circuit board 100 in the direction Y, the ends 185 and 190 define the first printed circuit board 100 in the direction X, that is to say the direction in which the auxiliary module 57 is intended to be extracted from the space 65 or inserted into the space 65.

The first face 175 carries the controller 80, the exciter 115 and the third electrical contact 170.

The region 120 is a region of the first board 100 that is free of metal. In particular, the various faces of the plates of the first board 100 are each free of metal, in particular the abovementioned layers, in the region 120. The faces 175 and 180 are therefore free of metal in the region 120.

The region 120 has for example a rectangular or square shape in the plane of extension of the board 100.

The region 120 has for example sides whose length is between 4 mm and 4.5 mm in the plane of extension of the board 100.

The region 120 is in particular surrounded in the plane of extension of the board 100 by a set of electrically conductive elements passing through the first board 100 in a direction perpendicular to the plane of extension of the first board 100, here the direction Y, and each connected to the ground of the auxiliary module 57.

The conductive elements passing through the first board 100 are for example arranged along a contour at least partially defining the region 120 in the plane of extension of the board 100, a distance between two successive conductive elements being for example between 1 and 3 millimetres.

The antenna 110 is arranged at the third end 185 of the first printed circuit board 100.

The third end 185, out of the ends 185 and 190, is closer to the front face 60 of the switching device 15 when the auxiliary module 57 is accommodated in a space 65.

In particular, a distance, in the direction X of insertion of the auxiliary module 57, between the exciter 115 and the front face 60, is between 5 mm and 10 mm.

A length of the first printed circuit board 100, measured between the ends 185 and 190 in the direction X, is for example between 20 mm and 30 mm, in particular between 26 mm and 27 mm.

Each first connection pad 165 is carried for example by the first face 175.

Each first connection pad 165 is electrically connected to the controller 80.

In particular, two of the first connection pads 165 are intended to be electrically connected to the circuit of the reception means 90, and electrically connected to two ports of the controller 80 so as to connect these ports to said circuit.

Another first connection pad 165 is also connected to the controller 80 and is intended to receive, from the second board 105, the supply current generated by the storage member 95, and to transmit this current to the controller 80 and/or to the communication module 85, directly or indirectly.

Each first connection pad 165 is formed by a layer of an electrically conductive material carried by the first face 175 or by the second face 180, as the case may be. This layer is in particular a portion of the abovementioned layers deposited on each face of the plates or interposed between two contiguous plates.

The electrically conductive material is in particular copper.

Each first connection pad 165 has for example a surface area of between 1 mm$^2$ and 10 mm$^2$, in particular equal to 4 mm$^2$.

Each first connection pad 165 is for example rectangular in the plane of extension of the first board 100.

Each first connection pad 165 is for example passed through by at least one strengthening element 195.

Each strengthening element 195 extends in the direction perpendicular to the plane of extension of the first printed circuit board 100, here the direction Y.

Each strengthening element 195 passes through the first printed circuit board 100 and opens out onto its two faces 175, 180. Furthermore, each strengthening element 195 has two ends, each end forming a protrusion from the face 175, 180.

Each strengthening element 195 is accommodated in a via, that is to say a hole passing at least partially, in the present case fully, through the first printed circuit board 100 in the direction Y.

Each strengthening element 195 is for example a tube extending in the direction Y and having, at each of its ends, a collar with a diameter greater than that portion of the strengthening element 195 that is interposed between the two collars along the direction Y.

Each strengthening element 195 has for example, in its central portion that is entirely accommodated within the corresponding via, an external diameter of between 0.3 mm and 0.4 mm, in particular equal to the diameter of the via, this being for example equal to 0.35 mm. The internal diameter of the central portion is for example between 0.2 mm and 0.3 mm.

The external diameter of each collar is strictly greater than the diameter of the via, and is for example between 0.4 mm and 0.6 mm, in particular equal to 0.50 mm to within 0.05 mm.

The collar protruding from the first face 175 also forms a protrusion from the first connection pad 165 that the strengthening element 195 passes through.

Each strengthening element 195 is for example obtained by depositing a metal material, in particular copper, in the corresponding via. Such depositions are known per se for electrically connecting portions of conductive layers carried by different plates or by different faces of one and the same plate of a printed circuit board.

The third electrical contact 170 is designed so that the second electrical contact of the storage member 95 bears against the third electrical contact 170, and to electrically connect the second electrical contact at least to the controller 80.

The third electrical contact 170 is for example a metal component formed by a folded plate so as to be able to be deformed by the storage member 95 bearing against the third electrical contact 170. The third electrical contact 170 thus ensures a good electrical connection between the third contact 170 and the second contact, while still allowing a small amount of play between the storage member 95 and the first printed circuit board 100.

The end face 160 that forms the second electrical contact in particular bears against the third contact 170 so as to exert a force oriented in the direction X thereon.

The second printed circuit board 105 extends from the first printed circuit board 100 in a direction substantially perpendicular to the plane of extension (X, Z) of the first board 100.

For example, the second board 105 extends in a plane perpendicular to the direction X.

In particular, the second printed circuit board 105 extends, in the direction Y, between a fifth end 200 and a sixth end 205.

"Extend in a direction substantially perpendicular to the plane of extension (X, Z) of the first board 100" is understood to mean in particular that the end 200 is offset, in the direction Y, from the first board 100, the second board 105 being in contact with the first board 100 at least at one point, without the second board 105 necessarily being perpendicular to the direction X.

The second printed circuit board 105 is fastened to the first board 100.

At least one portion of the second board 105, interposed between the ends 200 and 205, is for example accommodated in a hole passing through the first board 100 in the direction Y.

As a variant, as shown in FIG. 5, the sixth end 205 comprises one or more projections 210 each accommodated in a corresponding hole.

"Mortise and tenon" fastening is thus obtained between the first printed circuit board 100 and the second printed circuit board 105.

The one or more portions of the second board 105 that is or are inserted into one or more corresponding holes of the first board 100 is or are in particular configured, when it or they is or are inserted into the one or more corresponding holes, to prevent a translational movement in the plane of extension of the first board 100 between the boards 100 and 105.

Each hole accommodating a portion of the second board 105 defines for example one or more of the first connection pads 165 in the plane of extension of the first board 100.

A distance, in the direction Y, between the first printed circuit board 100 and the fifth end 200 is for example less than or equal to 20 mm, in particular less than or equal to 15 mm, in particular equal to 8.5 mm.

The second printed circuit board 105 has a third face 215 and a fourth face 220 that, together, define the second board 105 in the direction X.

Out of the faces 215 and 220, the third face 215 is closer to the front face 60 when the auxiliary module 57 is accommodated in a space 65. The fourth face 220 faces the mobile element 125, which is configured to bear against the fourth face 220 when the mobile element 125 is in the second position. In particular, the second spring 140 bears against the fourth face 220. The electrical circuit is in particular carried by the fourth face 220.

The second printed circuit board 105 carries the abovementioned electrical circuit (which interacts with the mobile element 125), at least two second connection pads 225, in particular three second connection pads 225 and a fourth electrical contact 230.

Each second connection pad 225 is formed by a layer of an electrically conductive material carried by the third face 215 or the fourth face 220, as the case may be. This layer is in particular a portion of the abovementioned layers deposited on each face of the plates or interposed between two contiguous plates.

The electrically conductive material is in particular copper.

In particular, each of the faces 215 and 220 carries at least one second connection pad 225. For example, as may be seen in FIG. 4, the face 215 carries two second connection pads 225 and the face 220 carries at least one second connection pad 225.

Each second connection pad 225 has for example a surface area of between 3 mm$^2$ and 10 mm$^2$, in particular equal to 6 mm$^2$.

Each second connection pad 225 is for example rectangular in the plane of extension of the second board 105.

Each second connection pad 225 is for example passed through by one or more strengthening elements 195 passing through the second board 105 in the direction X, this or these strengthening elements in particular being identical to those of the first pads 165.

Each second connection pad 225 is configured to be electrically connected to a corresponding first connection pad 165.

Each second connection pad 225 is in particular defined in the plane of extension of the second board 105 by the corresponding first connection pad 165 when the second board 105 is inserted into the one or more holes in the first board 100. The second connection pad 225 and the corresponding first connection pad 165 thus together form a square.

According to one embodiment, each second connection pad 225 is soldered to the corresponding first connection pad 165 by a metal mass.

The metal is for example a tin-based alloy.

Each metal mass is in particular fastened directly to the second connection pad 225 and to the first connection pad 165 so as to join the second connection pad 225 and the first connection pad 165.

Furthermore, each metal mass is joined to the strengthening elements 195 of the pads 165, 225 to which the mass is fastened, in particular the collar, going beyond each pad 165, 225, of each strengthening element 195.

Two of the second connection pads 225 are for example each connected to an end of the electrical circuit that the mobile element 125 is intended to close. These two second pads 225 are each connected to a port of the controller 80 by a corresponding first connection pad 165.

A third second pad 225 is electrically connected, by the one or more conductive layers of the second board 105, to the fourth electrical contact 230, so as to connect the fourth electrical contact 230 to the controller 80 and/or to the communication module 85 via a corresponding pad 165. The storage member 95 thus supplies electric power to the various elements of the auxiliary module 57, in particular the controller 80 and the communication module 85, via the contact 230 and the corresponding second pad 225.

The fourth contact 230 is electrically connected to, in particular by bearing against, the first electrical contact of the storage member 95.

The fourth contact 230 is carried for example by the face 215.

The fourth contact 230 is for example formed by one or more flexible metal elements designed to deform when the storage member 95 bears against the fourth contact 230.

The fourth contact 230 is in particular configured to exert, on the storage member 95, a force that tends to move the storage member 95 in the plane formed by the directions X and Z, for example in the direction X.

The monitoring device 20 is remote from the switching device 15. In particular, the monitoring device 20 is not in contact with the switching device 15. In addition, the monitoring device 20 comprises for example a separate housing remote from the first housing 60.

A distance between the devices 15 and 20 is for example less than or equal to 100 metres.

The monitoring device 20 is configured to receive the messages transmitted by each auxiliary module 57 and to indicate each state of the one or more switching devices 15 to an operator.

The monitoring device 20 comprises for example a radiofrequency receiver 235, a human-machine interface 240 and a display screen 245.

The receiver 235 is configured to receive each message generated by the one or more communication modules 85 of the one or more auxiliary modules 57.

The human-machine interface 240 is able to allow the operator to exchange information with the monitoring device 20, for example in order to command the display, by the screen 245, of the state of a specific switching device 15 from among all of the switching devices 15.

By virtue of using a radiofrequency data link, it is no longer necessary to provide dedicated passages for the electrical conductors connecting the auxiliary module to the monitoring device, and the risk of loss of communication between the auxiliary module and the monitoring device is reduced since it is then no longer sensitive to damage to an electrical conductor. The auxiliary module is therefore both easier to integrate and safer.

The use of two printed circuit boards 100 and 105, one of which extends in a direction perpendicular to the other board, allows this board 105 to interact easily with the mobile member 125 so as to allow the latter to indicate the state of the switching device 15, while still allowing the other board 100 to be positioned more easily in the auxiliary module 57. The various elements carried by the boards 100 and 105 (controller 80, communication module 85, any contacts 170 and 230) may thus be distributed over these two boards 100 and 105 so as to able to choose or adapt the respective dimensions of these boards 100 and 105 so as to facilitate integration thereof into the second housing 75.

In particular, when the second board 105 is perpendicular to the direction X in which the auxiliary module 57 is intended to be inserted into or extracted from the space 65, the mobile member 125 may then extend in this same direction X so as thus to be actuated easily by the actuation means without either the mobile member 125 or the actuation means forming a barrier to insertion of the auxiliary module 57 into the space 65. In addition, the mobile member 125 then reliably opens or closes the circuit carried by the board 105.

The use of one or more projections of the second board 105 that is or are inserted into the first board 100 in order to prevent the translational movement thereof with respect to the first board 100 makes it possible to join them easily and effectively, in particular in order to withstand the forces applied by the mobile member 125 in the direction X to the board 105.

Soldering the corresponding pads 165 and 225 to one another also makes it possible to keep the two boards 100 and 105 in position with respect to one another, and in particular to avoid these two boards pivoting with respect to one another under the effect of the force exerted by the member 125.

When the two faces of the second board 105 each carry at least one second pad 225 soldered to the corresponding pad 165, the mechanical strength of the two boards 100, 105 with respect to one another is particularly improved.

The presence of the strengthening elements 195 in vias opening out onto the pads 165, 225 makes it possible to bolster mechanical strength, since the metal mass used for the soldering is joined not only to the pads 165 and 225, which consist of relatively thin layers of metal, but also to the strengthening elements 195 that pass through the entire board 100, 105. The force is thus distributed over the entire thickness of the board 100, 105 and not only over the pad 165, 225, and the risk of the latter tearing off is therefore greatly reduced.

The presence of the two boards 100 and 105 extending in different directions from one another also makes it possible to easily connect the two contacts of the storage member 95, for numerous storage member 95 configurations, in particular if they are carried by mutually perpendicular faces 155 and 160 of the storage member 95. In particular, for relatively flat members 95, this makes them easier to orient parallel to the plane (X, Z), thereby contributing to reducing the thickness of the auxiliary module 57 in the direction Y. Thus, since the switching devices 15 are generally designed so that the conductors and the mechanisms 40 that they comprise extend in the direction Z, the auxiliary modules 57 are able to be inserted easily between these various elements. Of course, the benefit of obtaining thin modules 57 remains regardless of the orientation of the mechanisms 40.

Antennas 110 comprising an exciter 115 and a metal-free region 120 make it possible to achieve relatively isotropic electromagnetic radiation and thus avoid the reliability of the communication with the device 20 depending excessively on its positioning relative to the switching device 15. This is particularly true when the exciter 115 is positioned between the region 120 and the front face 60.

When the antenna 110 is carried by the end 185, communication is made more reliable despite the presence of the metal conductors and switching elements 40.

Figure 6:
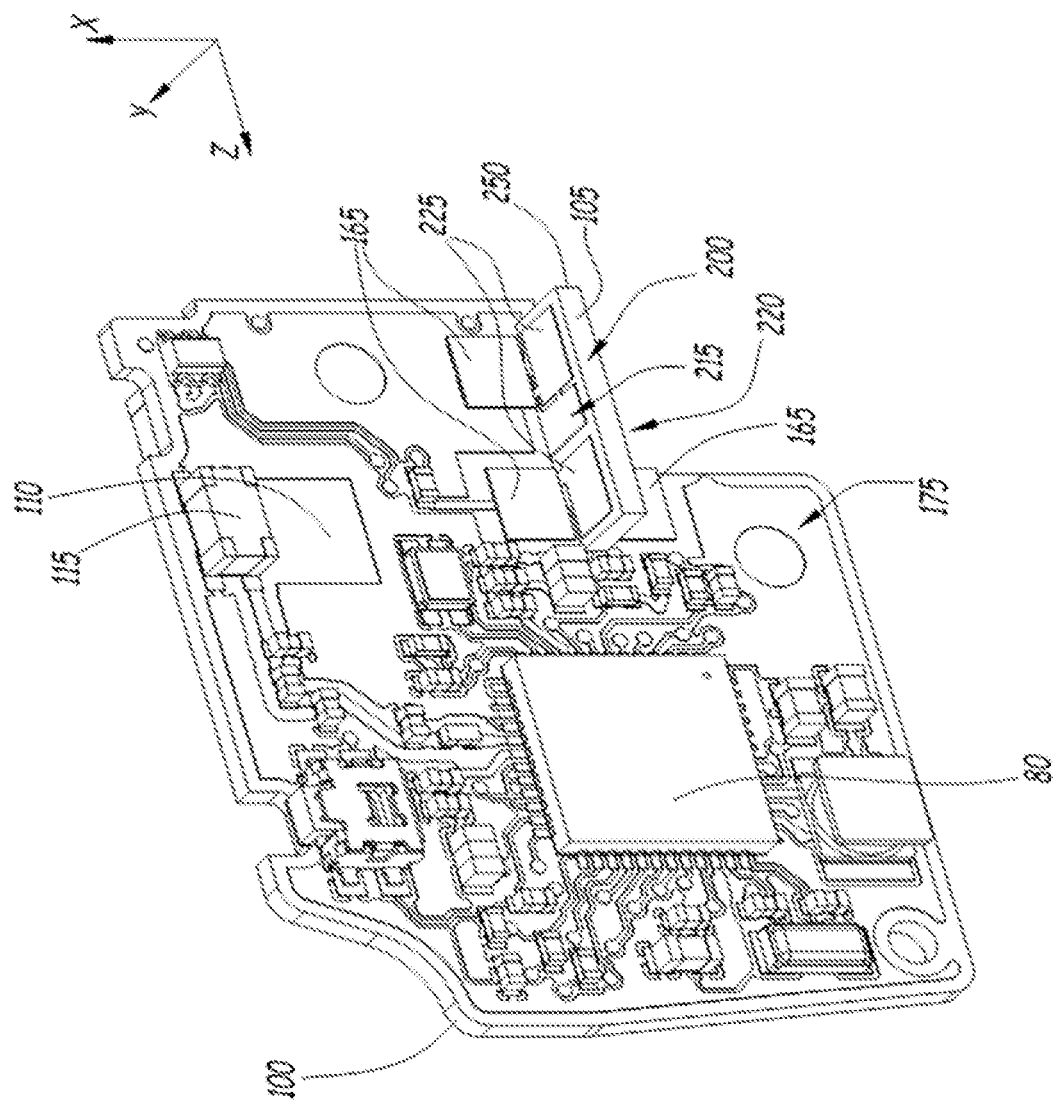
FIG. 6 is a perspective view of the two boards of a second example of an auxiliary module.
Figure 7:
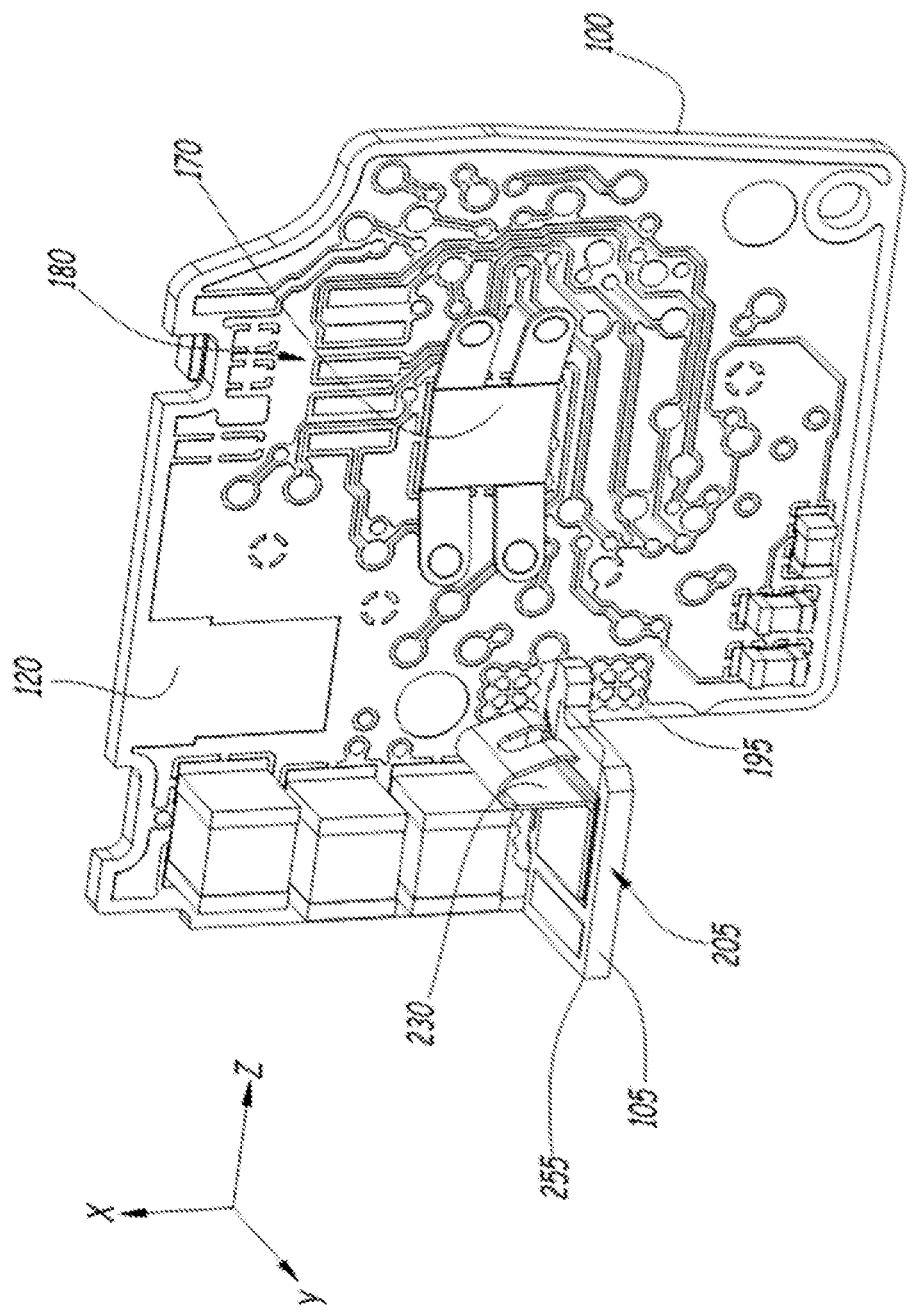
FIG. 7 is another perspective view of the two boards of the second example of an auxiliary module.

A second example of an auxiliary module 57 according to the invention will now be described with reference to FIGS. 6 and 7, which show boards 100 and 105 as well as the elements that they carry, in particular the controller 80 and the antenna 110.

Elements identical to the first example are not described again, and only the differences are highlighted.

One portion 250 of the second board 105 extends from one side of the first board 100, and another portion 255 extends from another side of the board 100.

For example, the portion 250 extends in the direction Y from the face 175 that carries the controller 80 and the communication module 85. The portion 250 carries for example the pads 225.

The portion 255 extends in the direction Y from the face 180. The portion 255 carries for example the fourth electrical contact 230.

It may thus be seen that numerous configurations of the boards 100 and 105 are possible.

Generally speaking, the distribution of the various elements carried by the boards 100 and 105 is liable to vary according to requirements, In addition, although embodiments comprising two boards 100 and 105 have been described in detail here, other embodiments without printed circuit boards or with a single board are also conceivable.

The invention claimed is:

1. An auxiliary module for an electrical switching device, the electrical switching device comprising at least an input, an output, and a first housing, wherein the electrical switching device is configured to switch between a first configuration in which an electric current is allowed to flow between the input and the output and a second configuration in which the flow of the current between the input and the output is blocked, the first housing defining a space for receiving the auxiliary module, the space containing at least one signalling member configured to transmit first information relating to a state of the electrical switching device to the auxiliary module when the auxiliary module is accommodated in the space,
wherein the auxiliary module comprises a controller configured to generate a message containing second information representative of the transmitted first information and a radiofrequency communication module configured to transmit the message, via a radiofrequency data link, to a device remote from the electrical switching device, and
wherein the auxiliary module further comprises a second housing, a first printed circuit board, a second printed circuit board and a mobile element, the second housing defining a chamber that accommodates the first board and the second board, the first printed circuit board carrying the controller and extending in a first plane, the second printed circuit board being connected to the first printed circuit board and extending from the first printed circuit board in a direction perpendicular to the first plane, the second printed circuit board carrying an electrical circuit connected to the controller, the mobile element being configured to be moved in translation by the signalling member in a direction of translation between a first position in which the electrical circuit is open and a second position in which the mobile element closes the electrical circuit, the state of the switching device being indicated by the open or closed state of said electrical circuit.

2. The auxiliary module according to claim 1, wherein the direction of translation is perpendicular to a second plane of extension of the second printed circuit board, the direction of translation being in particular a direction in which the auxiliary module is able to be inserted into the space or extracted from the space.

3. The auxiliary module according to claim 1, wherein the second printed circuit board comprises at least one projection inserted into a hole passing through the first printed circuit board so as to prevent a relative translational movement of the two printed circuit boards with respect to one another in the first plane.

4. The auxiliary module according to claim 1, wherein the first printed circuit board carries at least two first connection pads and the second printed circuit board carries at least two second connection pads, each first or second pad being carried by a face of the corresponding board, each second pad being connected to one of the first connection pads so as to allow an electric current to flow between the first connection pad and the second connection pad, the two second pads or two of the second pads being connected to said electrical circuit, each first pad being soldered to the corresponding second pad by an electrically conductive metal mass.

5. The auxiliary module according to claim 4, wherein the second printed circuit board has two faces defining the second board in a direction perpendicular to the second plane, each of the two faces of the second board carrying at least one of the second connection pads.

6. The auxiliary module according to claim 5, wherein each printed circuit board comprises, for at least one of the first or second pads of the board under consideration, a set of vias passing through the board in a direction perpendicular to the first or second plane of extension of the board under consideration, each via opening out through the first or second pad and containing a metal element passing through the printed circuit board under consideration.

7. The auxiliary module according to claim 1, comprising an electrical energy storage member intended to supply electric power to the controller and the communication module, the storage member extending in a third plane parallel to the first plane and having at least one lateral face defining the storage member in the third plane, the storage member comprising a first electrical contact and a second electrical contact and being configured to impose a voltage between the first contact and the second contact, the lateral face carrying the first electrical contact, the first electrical contact being connected to a third electrical contact carried by the second printed circuit board, the third electrical contact being connected to the controller and to the communication module via one of the second connection pads, there being three or more second connection pads.

8. The auxiliary module according to claim 7, wherein the first printed circuit board comprises a fourth electrical contact connected to the controller and to the communication module, the second electrical contact bearing against the fourth electrical contact.

9. The auxiliary module according to claim 1, wherein the communication module comprises an antenna, the antenna comprising a region free of any metal coating of the first printed circuit board and an exciter configured to generate at least one electromagnetic wave in said region.

10. The auxiliary module according to claim 9, intended for a switching device whose first housing has a front face intended to be accessible to an operator when the switching device is operational, wherein, when the auxiliary module is accommodated in said space, the exciter is interposed between said region and the front face.

11. The auxiliary module according to claim 9, intended for a switching device whose first housing has a front face intended to be accessible to an operator when the switching device is operational, wherein the first printed circuit board has a first end and a second end, the first end and the second end together defining the first board in a first direction perpendicular to the front face, the first end being, out of the first end and the second end, the end closer to the front face, wherein the antenna is carried by the first end.

12. An electrical switching device comprising at least the input, the output, the first housing, and the auxiliary module according to claim 1 and the electrical switching device configured to switch between the first configuration in which an electric current is allowed to flow between the input and the output and the second configuration in which the flow of the current between the input and the output is blocked, the first housing defining the space for receiving the auxiliary module, the space containing the at least one signalling member configured to transmit first information relating to a state of the electrical switching device to the auxiliary module when the auxiliary module is accommodated in the space.

13. The electrical switching device according to claim 12, wherein the first housing defines a plurality of reception spaces each configured to accommodate the auxiliary module, each reception space being associated with a respective state of the electrical switching device, different from the state associated with each other reception space, each reception space containing a respective signalling member configured to transmit first information relating to the associated state to an auxiliary module when the auxiliary module is accommodated in the reception space.

14. A system for monitoring an electrical installation, comprising at least a switching device according to claim 12 and a monitoring device configured to receive each message transmitted by the one or more auxiliary modules.

* * * * *